United States Patent

[11] 3,599,059

[72] Inventor Shou-Ling Hou
Corning, N.Y.
[21] Appl. No. 825,017
[22] Filed May 15, 1969
[45] Patented Aug. 10, 1971
[73] Assignee Corning Glass Works
Corning, N.Y.

[54] ION IMPLANTED CADMIUM SULFIDE PN JUNCTION DEVICE
1 Claim, 7 Drawing Figs.

[52] U.S. Cl. .......... 317/234 R, 317/235 AL, 148/1.5, 317/235 N
[51] Int. Cl. .......... H01l 7/54
[50] Field of Search .......... 317/235, 234

[56] References Cited
UNITED STATES PATENTS
3,515,956 6/1970 Martin et al. .......... 317/234
OTHER REFERENCES
Chernow et al., Applied Physics Letters, Vol. 12, No. 10, 15 May 1968. Article entitled " High Conductivity" p-type CdS.

*Primary Examiner*—John W. Huckert
*Assistant Examiner*—Martin H. Edlow
*Attorneys*—Clarence R. Patty, Jr., Walter S. Zebrowski and William J. Simmons, Jr.

ABSTRACT: PN junction devices are made by bombarding the surface of a body of cadmium sulfide with the ions of an appropriate dopant element, and thereafter subjecting the cadmium sulfide body to an appropriate annealing schedule. The particular type of PN junction device and the characteristics thereof are determined by the particular schedule of annealing to which the implanted body is subjected.

INVENTOR.
Shou-Ling Hou
BY William J. Simmons Jr.
ATTORNEY

INVENTOR.
Shou-Ling Hou
BY William J Simmons Jr
ATTORNEY

ION IMPLANTED CADMIUM SULFIDE PN JUNCTION DEVICE

BACKGROUND OF THE INVENTION

Cadmium sulfide belongs to a group of semiconductors which exhibits one majority carrier-type, usually electrons. Normal equilibrium impurity diffusion is very seldom useful in altering this situation, and as a consequence, a large number of materials, including cadmium sulfide, could not heretofore be considered for fabrication into PN junction devices.

Cadmium sulfide is an N-type, high bandgap compound semiconductor. The electron excess is postulated to be the result of sulfur vacancies, which accounts for its high electrical conductivity in the "as grown" state. Elements from Group VA of the Periodic Chart, which includes the elements N, P, As, Sb, and Bi, might normally be selected to impart P-type conductivity to cadmium sulfide when present in concentrations up to 1.0 mole percent. However, when these dopants are introduced under thermal equilibrium, the crystal becomes an insulator rather than a P-type semiconductor. One possible explanation is based on the theory of self-compensation whereby a nearly equal number of oppositely charged defects, in this case sulfur vacancies, will be created for every dopant atom introduced from the previous list of P-type impurities. In order to minimize self-compensation, the crystal must be doped under conditions which do not allow the crystalline lattice to reach high temperature equilibrium while introducing the appropriate impurity an adequate distance into the material.

U.S. Pat. application Ser. No. 824,035 filed on May 13, 1969, by J. A. Marley discloses a method of converting a portion of a body of normally N-type CdS to P-type material. This method utilizes an ion implantation technique whereby ions of a dopant element are implanted into one surface of a body of CdS. These implanted ions do not initially enter into an electrically active position in the CdS crystal lattice. Therefore, the implanted crystal must be thermally annealed to cause the implanted ions to enter into substitutional sites in the CdS lattice.

It has been discovered that the resulting PN junction devices function as light detectors, solar cells and light emitters, and that the operating characteristics of each of these devices are determined by the particular schedule of annealing to which they are subjected.

SUMMARY OF THE INVENTION

Therefore an object of the present invention is to provide PN junction devices made by ion implantation of crystalline bodies of CdS, and subsequently annealing the bodies to control the characteristics thereof.

Briefly, this invention relates to PN junction devices which function as light detectors, solar cells, and light emitters. These devices comprise a body of normally N-type crystalline cadmium sulfide, one surface of which has been converted to P-type material by implanting ions of a dopant element selected from Group VA of the Periodic Chart into one surface of the body and annealing the body at a temperature between 450° C. for a period of time sufficient to reduce radiation damage caused by the ion implantation and cause the implanted ions to enter into substitutional sites in the cadmium sulfide lattice. The period of time must be insufficient to cause the P-type material so formed to become degraded and lose its P-type conductivity. First and second electrodes are respectively disposed on the implanted surface and on a portion of the body that is remote from the implanted surface.

DETAILED DESCRIPTION

Figures 1, 2, 3, 4, 5:
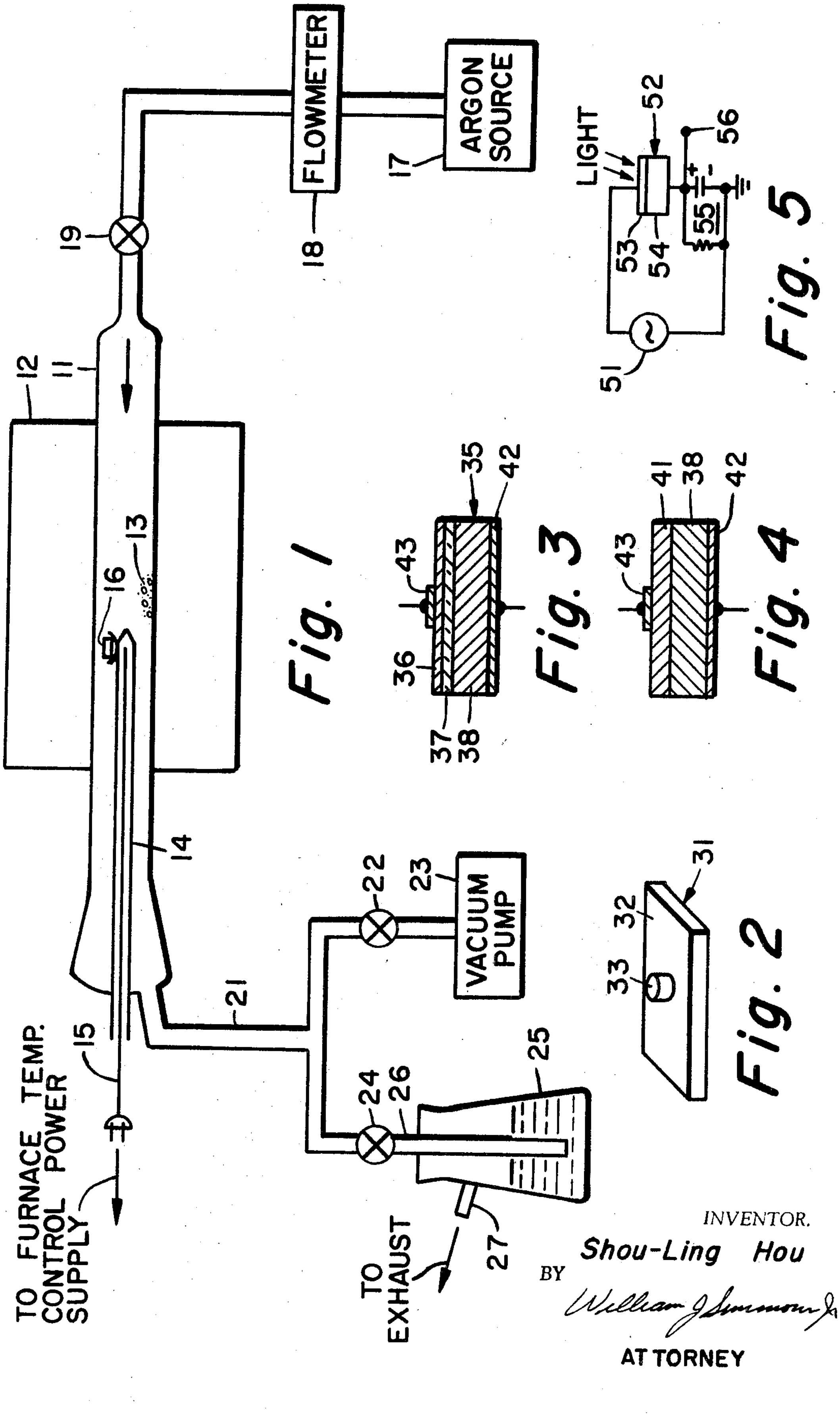
FIG. 1 is a schematic representation of an apparatus which may be used for annealing CdS bodies after ion implantation.
FIG. 2 is an oblique view of a support for holding an implanted CdS body during annealing.
FIG. 3 is a cross-sectional view of a cadmium sulfide body having a PN junction therein, and including an insulating layer caused by radiation damage.
FIG. 4 is a cross-sectional view of a cadmium sulfide body having a PN junction therein.
FIG. 5 is a schematic diagram of a circuit in which a light detecting diode is utilized.

Apparatus for implanting ions into a sample is well known and is described in the literature and in various patents including U.S. Pat. No. 3,388,009 issued to W. J. King on June 11, 1968 and U.S. Pat. No. 3,341,150 issued to R. P. Doland, Jr. et al. on March 4, 1969. Such apparatus basically consists of an ion source, an accelerator tube, a momentum analyzer and an ion deflection system. The sample is mounted on a plate which may be rotatable. The ion beam emerging from the deflection system is directed upon the sample.

Improved results were obtained when steps were taken to eliminate surface damage and contamination of the surface of the CdS body prior to implantation. Therefore, after a single crystal of CdS is cut, it is mechanically and chemically polished to produce a smooth damage-free surface. A 2 to 3 minute chemical polish using phosphoric acid at 190° C. was found to produce an optical surface with surface roughness below 500 A. Another chemical polish developed for cadmium sulfide consists of a combination of HCl, $HNO_3$, and $K_2Cr_2O$.

After the surface is polished, the CdS crystal is disposed on the sample holder of the ion implantation apparatus described above. Ions having energies from 10 kev up to 2 mev were implanted, 2 mev being the upper limit of the equipment used. The implantation temperature of the sample may conveniently be room temperature, although it may be below or above room temperature. In this apparatus phosphorous ions were implanted into single crystals of CdS at concentrations above the original electron concentration of the sample (typically at $10^{14}$ to $10^{15}$ ions/cm.$^2$) using beam currents of approximately 0.3 to 10 microamperes, beam currents of 0.5 to 1 microamperes being preferable. In another series of implantations, arsenic ions were implanted into crystals of cadmium sulfide at temperatures from 450° C. to 500° C. using beam currents of 0.1 to 0.5 microamperes. Post annealing was unnecessary for the devices which resulted from this hot implantation technique. Measurements of the IV characteristics of these devices indicate that the devices resulting from this technique are similar to those obtained by ion implantation at room temperatures and below and which are subjected to post implantation annealing. While only phosphorous and arsenic have been implanted in cadmium sulfide, any of the elements in Group VA of the Periodic Table should produce type conversion in this type of material.

Unless the ion implantation is performed at an elevated temperature, the implanted dopant atoms do not initially become electrically active; they are probably located in interstitial sites. Implantation also produces lattice damage caused by the nuclear bombardment. Proper annealing reduces the damage caused by ion bombardment and causes the dopant atoms to enter into substitutional sites in the CdS lattice. If the annealing temperature is too high or if the cadmium sulfide body is subjected to a moderate annealing temperature for too long a period of time, the entire crystal will be brought into thermal equilibrium thereby causing it to cease to be P-type and become insulating material.

FIG. 1 is a schematic representation of one type of apparatus which may be used to anneal implanted bodies of cadmium sulfide. A furnace tube 11 is located in a furnace 12 which may be of the induction heating type. A mixture 13 of small CdS crystals and cadmium powder may be spread on the wall of the furnace tube in the central part of the furnace. A body 16 of cadmium sulfide is located at the end of a support 14. The location of the body 16 is such that its temperature is slightly lower than that of the mixture 13. A lead wire 15 connects to a thermocouple which is located at the tip of the support 14 adjacent the body 16. This lead wire may be connected to the furnace temperature control power supply to precisely regulate the temperature of the body 16 during the annealing process. A source 17 of ultrapure inert gas such as argon is connected to the input end of the furnace tube 11 by way of a flowmeter 18 and a valve 19. The exhaust end of the furnace tube is connected to a vacuum pump by a line 21 and a valve 22. The line is also connected through a valve 24 to a pipe 26 which is located in an oil filled flask 25. The upper portion of the flask 25 is exhausted through the pipe 27.

FIG. 2 is oblique view of a support which may be provided for the implanted cadmium sulfide body during annealing. The support 31 consists of a cadmium sulfide member having a polished surface 32. The implanted surface of the cadmium sulfide body 33 is disposed adjacent the polished surface 32. This minimizes evaporation of the implanted surface during the annealing process.

With the valves 19 and 24 closed and the valve 22 opened, the system is initially pumped to a low pressure. Thereafter, the valve 19 is first opened to flush the system with pure argon gas and thereafter closed while the system is pumped again to assure that no oxygen gas remains therein. Finally, the valve 22 is sealed and the valve 19 is opened to permit pure argon gas to flow through the system at atmospheric pressure. The oil flask 25 is used at the exhaust end to prevent a backflow of air into the system. The flow rate of argon is controlled to about 60 to 130 cc./min. Then the furnace is turned on and is set to the desired annealing temperature. The warmup time is between 15 and 20 minutes, whereas the cooling time is about 15 to 30 minutes. The temperature at the center of the furnace 12 is such that cadmium and cadmium sulfide vapor from the material 13 is carried over the cadmium sulfide body 16 by the argon gas. The purpose of this vapor is to reduce the decomposition rate of the cadmium sulfide body. Although it is preferred to anneal in an atmosphere of argon and sulfur vapor, type conversion can be obtained by annealing in pure argon.

The amount of radiation damage which exists in an implanted body depends on such factors as the implantation energy, the total dose of implanted ions, crystal orientation and the like. Since one of the purposes for annealing the body after ion implantation is to reduce radiation damage, the annealing schedule is related to these implantation parameters, i.e., if radiation damage is extensive, the amount of annealing must be greater than that required to remove slight radiation damage.

Since the uniformity of the crystalline structure is disrupted by the ion bombardment, that portion of the crystal into which ions have penetrated becomes amorphous. Therefore, when an implanted crystal is annealed for only a short period of time, part of this amorphous layer remains and affects the characteristics of the device. The cross-sectional view in FIG. 3 shows a diode 35 which, after only a short annealing period, consists of a layer of P-type material 36 and an insulating layer 37 located on the surface of the bulk crystal 38 of N-type CdS. The junction depth is usually between a few hundred angstroms and 1 micron and is typically about 0.5 micron. Additional annealing reduces the insulating layer 37, and, as shown in FIG. 4, finally eliminates the insulating layer so that only a P-type layer 41 exists on the bulk crystal 38.

The devices shown in FIGS. 3 and 4 are electroded by applying a layer 42 of indium to the bulk of the cadmium sulfide body 38 by ultrasonically soldering it to the body and thereafter discharging a capacitor at 500 volts across the indium film. The resistance of these electrodes varied from about 15 ohms to 100 ohms. The P-type implanted side of the body can be electroded by sputtering a layer 43 gold or platinum thereon. It was preferred to sputter gold onto the implanted side in an area having a diameter of about a one-half mm. The resultant diodes are forward biased when the layers 36 and 41 of P-type material of FIGS. 3 and 4, respectively, are biased positive with respect to the bulk crystal 38.

FIG. 5 is a schematic diagram of a circuit in which the devices of FIGS. 3 and 4 can be placed to function as light detectors. A source 51 of AC potential is connected in series with a diode 52 and a parallel RC network 55. The P-type surface layer is designated by the numeral 53, and the N-type bulk crystal is designated by the numeral 54. With the diode oriented as shown, a positive DC potential is generated at the terminal 56 due to the rectification of the AC voltage supplied by the source 51.

If the light detector diode 52 is of the type illustrated in FIG. 3, it will have little or no dark current. This results from the fact that the insulating layer 37 is nonconducting in the absence of light, but it becomes conducting in the presence of light. If the diode is annealed for only a short period of time, e.g., about 10 to 15 minutes at a temperature between 450° C. and 525° C., the conductivity of the insulating layer 37 is such that the diode is nonconducting in the dark, but it behaves like a PN junction when light having a wavelength between about 5000 A. and 6500 A. is shined on it. This diode therefore converts the AC applied voltage to a DC voltage proportional to the incident light.

The photoconductive gain of this diode is between several hundred and a thousand. As the diode is annealed for longer periods of time, more acceptor sites are created and the damage is reduced so that the insulating layer diminishes and finally disappears. Since the lack of dark current is due to the effects of the insulating layer, the dark current increases as the insulating layer diminishes. However, the photoconductive gain increases as the annealing time is increased. For example, a photoconductive gain between $10^4$ and $10^5$ has been obtained by annealing at 500° C. for 3 hours. It is estimated that photoconductive gains greater than $10^4$ can be achieved by annealing at temperatures between 450° C. and 525° C. for periods of time between 1 and 3 hours.

Thus, it is seen that a light detecting diode is subjected to a particular amount of annealing depending on the characteristics desired. To detect small light levels, it is preferable to use a diode of the type illustrated in FIG. 3 which has been annealed for only a short period of time. Such a diode is preferred for small light levels since it has no dark current, and it provides a more accurate indication at low light levels. In applications where the light level is high, it is preferable to use a diode of the type illustrated in FIG. 4, since the photoconductive gain is much greater when the annealing is sufficient to cause a large number of impurity ions to diffuse into electrically active sites. For still other applications it may be desirable to utilize a diode which has been subjected to an intermediate period of annealing and which has a relatively small dark current and an intermediate photoconductive gain in the range of $10^3$ to $10^4$.

Figure 6:
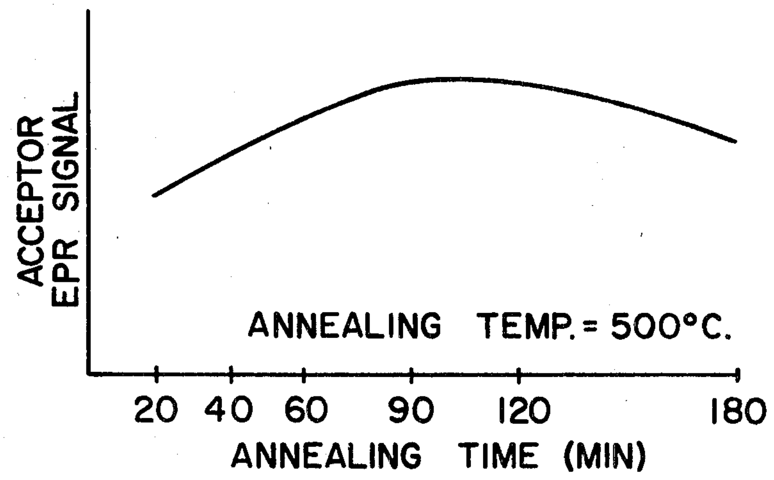
FIG. 6 is a graph of acceptor EPR signal vs. annealing time for an annealing temperature of 500° C.

An indication of the increase of acceptor sites due to the substitution of impurity ions into the cadmium sulfide crystal lattice may be monitored by the electron paramagnetic resonance (EPR) technique. FIG. 6 shows a graph of acceptor EPR signal vs. annealing time. This graph was compiled by measuring the acceptor EPR signal after an implanted cadmium sulfide crystal had been annealed for 20, 40, 60, 90, 120 and 180 minutes at a temperature of 500° C. This graph shows that the acceptor EPR signal increases with additional annealing and reaches a maximum after about 90—120 minutes of annealing time. Thereafter, additional annealing causes defects to develop in the crystal which begin to neutralize the P-type material and render it insulating. After about 180 minutes of annealing, the P-type layer begins to show excessive degradation. It is to be noted that annealing at one temperature for a first period of time will produce results which are similar to those produced by annealing at a slightly higher temperature for a shorter period of time. For example, annealing at 500° C. for 15 minutes may produce results similar to those obtained by annealing at 525° C. for 10 minutes. The junction becomes degraded when the device is annealed at 500° C. for a period of time longer than 3 hours. This appears to be due to a self-compensation effect whereby sulfur vacancies occur and offset the effects of donor impurity sites. Similarly, annealing at 625° C. for a very short period of time results in deterioration of the implanted surface.

Figure 7:
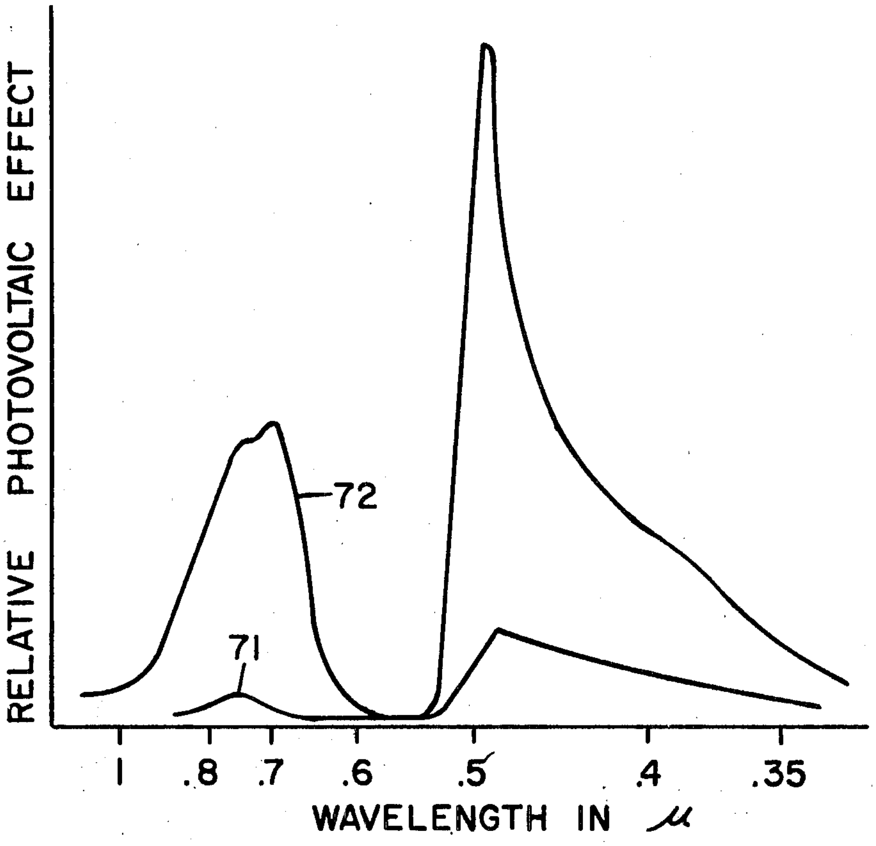
FIG. 7 is a graph illustrating the photovoltaic effect as a function of the wavelength of the incident light.

PN junction devices of the type described above also function as solar cells, and as in the case of the light detecting diode, the characteristics of the solar cell are determined by its annealing schedule. The equivalent circuit of any solar cell includes a series resistance $R_S$ and a shunt resistance $R_1$. A solar cell made by annealing an implanted crystal for up to 1 hour results in a device having a high shunt resistance and a high series resistance. These resistances are high since the insulating amorphous layer caused by ion bombardment has not yet been removed. Further annealing up to about 3 hours lowers both $R_s$ and $R_1$. However, additional annealing for over 3 hours causes both $R_1$ and $R_s$ to again become large. For example, annealing a crystal at 500° C. for 1—3 hours results in a solar cell having low series and shunt resistances. Additional annealing at 550° C. for 40 minutes causes both $R_1$ and $R_s$ to become high. The additional annealing after the original 3 hour period of annealing creates defects in the crystal which accounts for the change of characteristics. The spectral response of the photodiode characteristics showed a peak at 5150 A. and is identical with that of the bulk crystal. The photovoltaic effect illustrated in FIG. 7 showed two peaks at 4900 A. and 7000 A., the implanted layer being negative with respect to the bulk crystal. The former peak corresponds to the bandgap of cadmium sulfide at room temperature. The latter may correspond to the impurity-to-band transition. Hence, phosphorous implantation creates defects about 0.75—0.8 ev. below the bandgap after a prolonged annealing period. Curve 71 was obtained from a diode which was annealed at 500° C. for 3 hours. Curve 72 was obtained from a diode which was annealed at 500° C. for 3 hours and thereafter annealed at 550° C. for 40 minutes.

Diodes annealed for 1—3 hours at 450° C. to 520° C. emit yellow light under the proper conditions. The diode must be initially cooled to a temperature substantially lower than room temperature, and light must be used to restore the highly conductive PN junction behavior. The temperature of liquid nitrogen is a convenient temperature at which to obtain light emission. While maintaining the forward bias, the light source is removed, and the diode will emit yellow light while drawing a current of about 30 ma.

I claim:

1. A PN junction device comprising a body of normally N-type crystalline cadmium sulfide, one surface of which has been converted to P-type material by implanting therein ions of a dopant element selected from the group consisting of nitrogen, phosphorous, arsenic, antimony, and bismuth, and annealing said body at a temperature between 450° C. and 525° C. for a period of time between 1 and 3 hours, and first and second electrodes respectively disposed on said one surface and on a portion of said body that is remote from said one surface, said annealing reducing radiation damage caused by said ion implantation and causing said implanted ions to enter into substitutional sites in the cadmium sulfide lattice, the period of time during which said body is annealed being insufficient to deteriorate the electrical properties of the type converted surface.